United States Patent
Jelonnek et al.

(10) Patent No.: US 6,255,977 B1
(45) Date of Patent: Jul. 3, 2001

(54) SIGMA-DELTA-D/A-CONVERTER

(75) Inventors: Bjoern Jelonnek, Ulm; Detlev Nyenhuis, Sibesse, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/600,845

(22) PCT Filed: Nov. 24, 1999

(86) PCT No.: PCT/DE99/03727

§ 371 Date: Sep. 5, 2000

§ 102(e) Date: Sep. 5, 2000

(87) PCT Pub. No.: WO00/31877

PCT Pub. Date: Jun. 2, 2000

(30) Foreign Application Priority Data

Nov. 24, 1998 (DE) .............................................. 198 54 124

(51) Int. Cl.[7] .................................................... H03M 3/00

(52) U.S. Cl. ............................................ 341/143; 341/144

(58) Field of Search ................................... 341/143, 144, 341/118, 77, 120, 117, 142, 145; 340/347

(56) References Cited

U.S. PATENT DOCUMENTS

| | | | |
|---|---|---|---|
| 5,084,702 | * | 1/1992 | Ribner ................................. 341/143 |
| 5,181,032 | * | 1/1993 | Ribner ................................. 341/143 |
| 5,982,317 | * | 11/1999 | Steensgaard-Madsen ........... 341/143 |

OTHER PUBLICATIONS

"Delta Sigma Data Converter, Theory, Design and Simulation", Von Stev R. Norsworthy, et al IEEE Press 1997, ISBN 0–7803–1045–4.

* cited by examiner

*Primary Examiner*—Brian Young
*Assistant Examiner*—John Nguyen
(74) *Attorney, Agent, or Firm*—Michael J. Striker

(57) ABSTRACT

The present invention is directed to a sigma-delta D-A converter (300) with N stages, in which the nth stage, where n=1, 2, 3 . . . N, comprises a first adder (10) which adds a use signal x(k) (12) with an error signal $err_n(k-1)$ to an input signal $e_n(k)$ (14), a quantizer (16) which quantizes the input signal $e_n(k)$ (14) to an output signal $y_n(k)$ (18) according to a predetermined quantization function, and a second adder (20) which adds the input signal $e_n(k)$ (14) with the inverted output signal $y_n(k)$ to $x_n(k)$ (21), and supplies it to a delay device (22) which sends the signal $x_n(k)$ (21) to the first adder (10) as an error signal $err_n(k-1)$ with a delay by a clock period. For this purpose, an amount reducer (24) is provided between the second adder (20) and the delay device (22), which amount reducer (24) leaves the signal $x_n(k)$ (21) unchanged when $x_n(k)=0$ and otherwise lowers the amount $|x_n(k)|$ of the signal $x_n(k)$ (21) by at least a smallest representable numerical unit, wherein the quantization function of the quantizer (16) of the nth stage of the sigma-delta D-A converter (300) is expressed as follows:

$$y_n(k) = \begin{cases} 2^{(1-n)}, & \text{if } e_n(k) > 2^{-n} \\ 0, & \text{if } abs(e_n(k)) \leq 2^{-n} \\ -2^{(1-n)}, & \text{if } e_n(k) < -2^{-n}. \end{cases}$$

4 Claims, 3 Drawing Sheets

SIGMA-DELTA-D/A-CONVERTER

TECHNICAL FIELD

The invention is directed to a sigma-delta D-A converter with N stages, in which the nth stage, where n=1, 2, 3 . . . N, comprises a first adder which adds a use signal or use signals x(k) with an error signal $err_n(k-1)$ to an input signal $e_n(k)$, a quantizer which quantizes the input signal $e_n(k)$ to an output signal $y_n(k)$ according to a predetermined quantization function, and a second adder which adds the input signal $e_n(k)$ with the inverted output signal $y_n(k)$ to $x_n(k)$, and supplies it to a delay device which sends the signal xn(k) to the first adder as an error signal $err_n(k-1)$ with a delay by a clock period according to the preamble of claim 1.

PRIOR ART

A sigma-delta D-A converter of the generic type is known from the book "Delta Sigma Data Converter, Theory, Design and Simulation", by Steven R. Norsworthy, Richard Schreiner and Gabor C. Temes, IEEE Press 1997, ISBN 0-7803-1045-4. Known sigma-delta D-A converters of this type have the disadvantage that they are not asymptotically stable and, in short, are astable. In this respect, unwanted limit cycles may be generated by the sigma-delta D-A converter when the input signal of the converter is zero, i.e., when the converter is not excited. These limit cycles may possibly assume high amplitudes which are audible as NF amplitude, for example, in modulation pauses of a wanted broadcast signal, or which degrade the signal-to-noise ratio. Further, without an input signal, sigma delta D-A converters generate a "digital noise", as it is called, i.e., a zero input signal ($x(k)=0$ for all $k >= k_0$) is not uniquely imaged on a zero output signal, but on a sequence of output values which waver around the zero position and accordingly generate noise. The reason for this resides in ideal discrete integrators and in the utilized quantizers. The effects mentioned above impair the functionality and usefulness of such D-A converters.

DESCRIPTION OF THE INVENTION, OBJECT, SOLUTION, ADVANTAGES

It is the object of the present invention to provide an improved sigma-delta D-A converter of the type mentioned above which eliminates the above-mentioned disadvantages.

This object is met by a sigma-delta D-A converter of the type mentioned above having the characterizing features of claim 1.

For this purpose, it is provided, according to the invention, that an amount reducer is provided between the second adder and the delay device, which amount reducer leaves the signal $x_n(k)$ unchanged when $x_n(k)=0$ and otherwise lowers the amount $|x_n(k)|$ of the signal $x_n(k)$ by at least the smallest representable numerical unit, wherein the quantization function of the quantizer of the nth stage of the sigma-delta D-A converter is expressed as follows:

$$y_n(k) = \begin{cases} 2^{(1-n)}, & \text{if } e_n(k) > 2^{-n} \\ 0, & \text{if } abs(e_n(k)) \leq 2^{-n} \\ -2^{(1-n)}, & \text{if } e_n(k) < -2^{-n} \end{cases}$$

where abs( ) is the absolute value function. This has the advantage that the sigma-delta D-A converter according to the invention has an asymptotically stable behavior, i.e., all optional starting values of the integrators of the sigma-delta D-A converter reach the zero state in infinity. Further, the necessary quantity of output stages of the D-A converter is minimized, which reduces expenditure on subsequent circuits.

Preferred further developments of the device are described in claims 2 to 4.

A use signal of the nth stage, where n>1, is advisably the output signal $x_{n-1}(k)$ of the second adder of the (n-1)th stage, wherein the nth stage (n-1) has differentiators following the quantizer when there are two or more stages.

A conclusive combination of the output signals of all stages is achieved in that the first (N-1) stages, where N>1, each have a third adder which follows the quantizer in the case of the first stage and which follows the differentiators in the case of the second to (N-1)th stage, wherein every third adder of the first to (N-2)th stages is connected with the respective third adder of the next highest stage and the third adder of the (N-1)th stage is connected with the last differentiator of the Nth stage.

BRIEF DESCRIPTION OF THE DRAWINGS

The invention will be described more fully in the following with reference to the accompanying drawings.

BEST MODE FOR CARRYING OUT THE INVENTION

Figure 1:
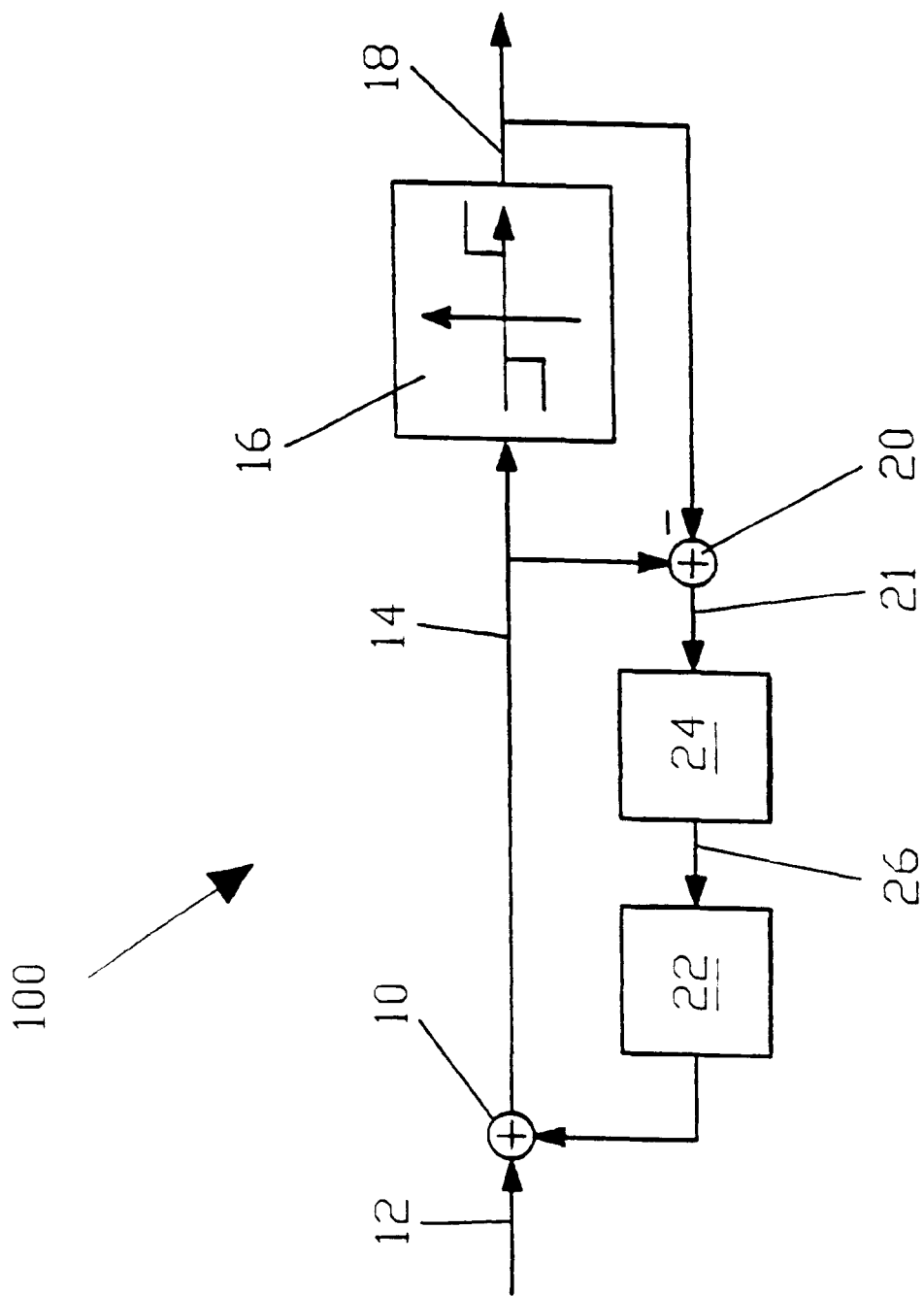
FIG. 1 shows a first preferred embodiment form of a sigma-delta D-A converter according to the invention.

The first preferred embodiment form of a sigma-delta D-A converter 100 according to the invention shown in FIG. 1 is a single-stage type (N=1) and comprises a first adder 10 which receives a use signal x(k) at 12 and, with an error signal $err_1(k-1)$, adds it to an input signal $e_1(k)$ at 10 to form a signal 14. A quantizer 16 following the adder 10 quantizes the input signal $e_1(k)$ according to a predetermined quantization function to form an output signal $y_1(k)$ at 18. A second adder 20 adds the input signal $e_1(k)$ with the inverted output signal $y_1(k)$ to $x_1(k)$ at 21 and supplies it to a delay device 22 which sends the signal $x_1(k)$ to the first adder 10 with a delay by a clock period as the error signal $err_1(k-1)$.

An amount reducer 24 which leaves the signal $x_1(k)$ unchanged when $x_1(k)=0$ and otherwise reduces the absolute value $|x_1(k)|$ of the signal $x_1(k)$ by at least the smallest representable numerical unit is provided between the second adder 20 and the delay device 22. A corresponding output signal $z_1(k)$ of the amount reducer 24 is at 26 and forms the input signal for the delay device 22. The quantization function $q_1(e_1(k))$ of the quantizer of this individual stage of the sigma-delta D-A converter is expressed according to the invention as follows:

$$y_1(k) = \begin{cases} 1, & \text{if } e_1(k) > 1/2 \\ 0, & \text{if } abs(e_1(k)) \leq 1/2 \\ -1, & \text{if } e_1(k) < -1/2 \end{cases}$$

In this case, k=1, 2, 3, . . . etc. designates the kth sampling value and is accordingly equivalent to a discrete time. At a sampling frequency $f_a$, a time or period duration T between two sampling processes is given by $T=1/f_a$. Accordingly, the kth sampling value corresponds to a previous time $t(k)=k*T$.

Figure 2:
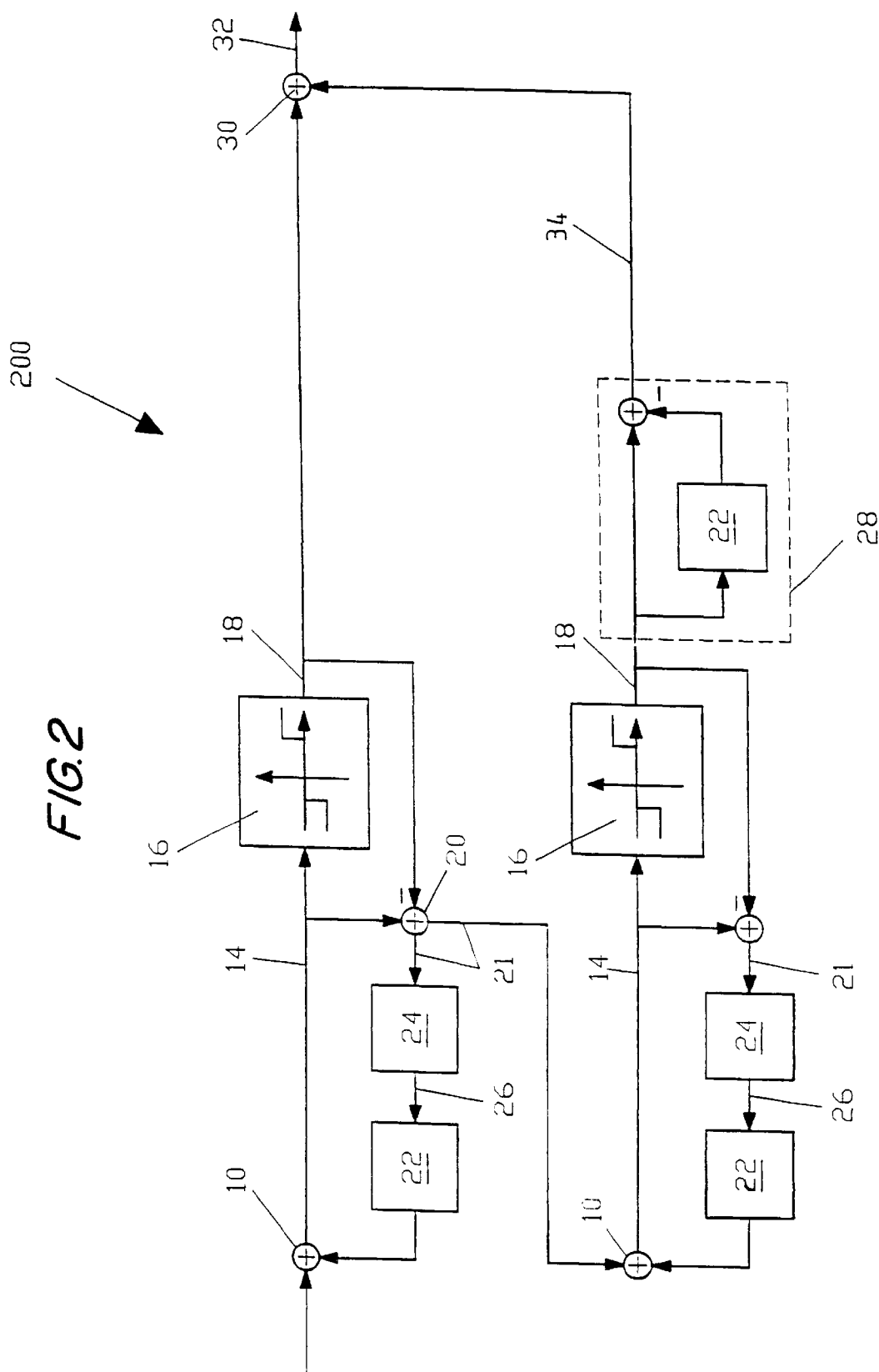
FIG. 2 shows a second preferred embodiment form of a sigma-delta D-A converter according to the invention.

The second preferred embodiment form of a sigma-delta D-A converter 200 according to the invention which is shown in FIG. 2 is a two-stage type (N=2) in which two stages of the type according to FIG. 1 are combined in such a way that the output $x_1(k)$ of the second adder 20 of the first stage serves as an input signal for the first adder 10 of the second stage. Further, the quantizer 16 of the second stage is followed by a digital differentiator 28 whose output is fed to an input of an additional, third adder 30 of the first stage so that the output signal y(k) results at 32. All identical parts in the respective stages are designated by the same reference numbers and reference is had to the preceding remarks pertaining to FIG. 1 for explanation. Further, the respective index n of the input signal $e_n(k)$ at 14, output signal $y_n(k)$ at 18, signal $x_n(k)$ at 21 and $z_n(k)$ at 26 is increased by one for the second stage, so that signals $e_2(k)$, $y_2(k)$, $x_2(k)$ and $z_2(k)$ are given at the indicated locations in the second stage.

The quantization function $q_1(e_1(k))$ of the first stage corresponds to those according to the first preferred embodiment form 100 according to FIG. 1. The quantization function $q_2(e_2(k))$ of the second stage is expressed as follows:

$$y_2(k) = \begin{cases} 1/2, & \text{if } e_2(k) > 1/4 \\ 0, & \text{if } abs(e_2(k)) \leq 1/4 \\ -1/2, & \text{if } e_2(k) < -1/4 \end{cases}$$

In the third preferred embodiment form of a sigma-delta D-A converter 300 according to the invention, a third stage having two differentiators 28 is provided (N=3), analogous to the second embodiment form 200. All identical parts in the respective stages are designated by the same reference numbers and reference is had to the preceding remarks pertaining to FIGS. 1 and 2 for explanation. The corresponding signals $e_3(k)$, $y_3(k)$, $x_3(k)$ and $z_3(k)$ of the third stage are at locations 14, 18, 21 and 26. The respective output signals $y_1(k)$, $y_2(k)$ and $y_3(k)$ are again added via the third adder 30 of the respective stages to the output signal y(k) at 32.

The quantization functions $q_1(e_1(k))$ and $q_2(e_2(k))$ of the first and second stages correspond to the quantization function of the first and second stage according to the second embodiment form 200 of FIG. 2. The quantization function $q_3(e_3(k))$ of the third stage is expressed as follows:

$$y_3(k) = \begin{cases} 1/4, & \text{if } e_3(k) > 1/8 \\ 0, & \text{if } abs(e_3(k)) \leq 1/8 \\ -1/4, & \text{if } e_3(k) < -1/8 \end{cases}$$

For an embodiment form with n stages, where n=1, 2, 3, . . . N, the respective quantization function $q_n(e_n(k))$ of the nth stage is expressed as follows:

$$y_n(k) = \begin{cases} 2^{(1-n)}, & \text{if } e_n(k) > 2^{-n} \\ 0, & \text{if } abs(e_n(k)) \leq 2^{-n} \\ -2^{(1-n)}, & \text{if } e_n(k) < -2^{-n} \end{cases}$$

with respective signals $e_n(k)$, $y_n(k)$, $x_n(k)$ and $z_n(k)$ at 14, 18, 21 and 26 in the nth stage. A respective signal $y_{nd}(k)$ is given at 34 after the final differentiator 28 of the second and each subsequent nth stage.

The amount reducer 24 of the respective stage does not result in a conventional rounding up or rounding down but, rather, always in a reduction of the value of the signal $x_n(k)$, unless $x_n(k)=0$. In other words, each amount reducer 24 removes energy from the sigma-delta D-A converter so that it is clear that no limit cycles can come about. However, this will also be illustrated mathematically in the following with reference to the first embodiment form 100 according to FIG. 1.

x(k) is the digital input signal at 12 with a value range between −1 and 1. $e_1(k)$ is the input signal of the quantizer 16. y(k) is the output signal of the single-stage sigma-delta D-A converter 100 at 32. In this case with the single-stage sigma-delta A-D converter, $y_1(k)=y(k)$. Let the input signal x(k) not be equal to zero for the $k_0$th sampling value and before this, i.e., until time $t_0=k_0*T$, and let x(k)=0 after time $t_0$, i.e.:

$$x(k) = \begin{cases} x(k), & k < k_0 \\ 0, & \text{otherwise} \end{cases}$$

This case occurs, for example, in communications systems when $t_0$ is followed by a modulation pause. At this time $t_0$, there is a numerical value I0 in the delay device 22 which can be regarded as an initial value or starting value for a time segment in which there is no excitation of the sigma-delta D-A converter. The amount reducer 24 executes the following function:

$$z_1(k) = \begin{cases} x_1(k) + 1LSB, & \text{if } x_1(k) < 0 \\ 0, & \text{if } x_1(k) = 0 \\ x_1(k) - 1LSB, & \text{if } x_1(k) > 0 \end{cases}$$

In this case, LSB designates a smallest representable numerical unit. Alternatively, a multiple of LSB can be added or subtracted.

Let $I0=vz*b/2^{(w-1)}$ at time $t_0$, where vz is the sign + or −, b is a numerical value and w is a word length represented in twos complement. For example, with 16 bits, a significance of 15 bits is given, where a bit serves as mathematical sign.

In the first case, let $b > 2^{14}$, which corresponds to a value in the delay device of $I0 > ½$. Then:

$$e_1(k) = B[e_1(k-1) - y_1(k-1)]$$
$$= B[e_1(k-1) - q_1(e_1(k-1))],$$

where B is the amount reducing function of the amount reducer 24 and $q_1$ is the quantization function of the quantizer 16. Further, under the assumption and by putting in $$e_1(0) = I0 = b/2^{15} > 1/2,$$
$$e_1(1) = B[b/2^{15} - 2^{15}/2^{15}], \quad e_1(0) > 1/2 = > q(e_1(0)) = 1$$
$$= B[(b - 2^{15})/2^{15}], \quad (b - 2^{15})/2^{15} < 0$$
$$= (b + 1 - 2^{15})/2^{15}$$

Let $0 > e_1(1) > -1/2$
$$e_2(2) = B[e_1(1) - q(e_1(1))], \quad q(e_1(1)) = 0$$
$$= B[e_1(1)]$$
$$= (b + 2 - 2^{15})/2^{15}$$

gives, generally, $$e_1(k) = \begin{cases} \frac{(b+k-2^{15})}{2^{15}}, & \text{if } b+k < 2^{15} \\ 0, & \text{otherwise} \end{cases}$$

The following is given for the output sequence $y_1(k)$:

$$y_1(k) = \begin{cases} 1, & \text{if } k = 0 \\ 0, & \text{otherwise} \end{cases}$$

In the second case, let $0 < b < 2^{14}$. Analogously, this gives:

$$e_1(k) = \begin{cases} \dfrac{(b-k)}{2^{15}}, & \text{if } b-k > 0 \\ 0, & \text{otherwise} \end{cases}$$

and $y_1(k)=0$ for all k. The third case where $2^{14} < b < 0$ is proven in a manner analogous to the second case, and the fourth case where $b < -2^{14}$ is proven analogously to the first case.

In the single-stage case in question, as well as in the embodiment forms 200 and 300 with a plurality of stages, the first stage of the sigma-delta D-A converter supplies the signal $e_1(k)=0$ in the absence of excitation, i.e., input signal $x(k)$ equals zero, after an infinite time. In the worst case, this time can be estimated as follows:

$$t_{max} = (\tfrac{1}{2} \cdot 2^{(w-1)} + 1) \cdot T, \text{ where } T=1/f_a, f_a \text{ sampling frequency.}$$

After this maximum time, signal $e_1(k)=0$ and, therefore, the output signal of the second adder 20 $x_1(k)$ likewise equals 0. The second stage works analogous to the first stage and after infinite time delivers output signal $y_2(k)=0$. This principle can be expanded in an obvious manner to n-stage sigma-delta D-A converters.

Further, through selection of the quantizer, according to the invention, of the respective stages, there is a reduction in the range of values of the output signal $y(k)$, which will be explained in more detail in the following with reference to the two-stage sigma-delta D-A converter 200 according to FIG. 2.

The signal $y_1(k)$ after the quantizer 16 of the first stage has possible values 1, 0, −1. The signal $y_2(k)$ after the quantizer 16 of the second stage has possible values ½, 0, −½. After the differentiator 28 in the second stage, possible values 1, ½, 0, −½, −1 are given for $y_2d(k)$. Therefore, signal $y(k)$ after the third adder 30 of the first stage has possible values 2, 1½, 1, ½, 0, −½, −1, −1½, −2

However, values 2 and −2 do not exist at output 32 as can be shown by contradiction:

Assume $y(k)=2$ $$y(k)=2$$

$$\Leftrightarrow y_1(k)=1 \text{ and } y_2d(k)=1$$

$$\Leftrightarrow y_1(k)=1 \text{ and } y_2(k)=\tfrac{1}{2} \text{ and } y_2(k-1)=-\tfrac{1}{2}$$

$$\Leftrightarrow e_1(k) > \tfrac{1}{2} \text{ and } e_2(k) > \tfrac{1}{4} \text{ and } e_2(k-1) < -\tfrac{1}{4}$$

Further, when $q_1, q_2, \ldots q_n$ equals the respective quantization function of the 1 st, 2nd, ... nth stage:

$$e_2(k) = e_2(k-1) - q_2(e_2(k-1)) + (e_1(k) - q_1(e_1(k)))$$

$$= -\tfrac{1}{4} - eps_1 - \left(-\tfrac{1}{2}\right) + \left(\tfrac{1}{2} + eps_2 - 1\right),$$

where $eps_1, eps_2 > 0$ $$= eps_2 - eps_1 - \tfrac{1}{4}$$

$$\Leftrightarrow \tfrac{1}{4} + eps_3 = eps_2 - eps_1 - \tfrac{1}{4}, \quad \text{where } eps_3 > 0$$

$$\Leftrightarrow \tfrac{1}{2} = eps_2 - eps_1 - eps_3$$

However, this is a contradiction, since $eps_2 <= \tfrac{1}{2}$ and $eps_1$, $eps_3 > 0$. By analogy, $y(k)=-2$ is impossible.

Figure 3:
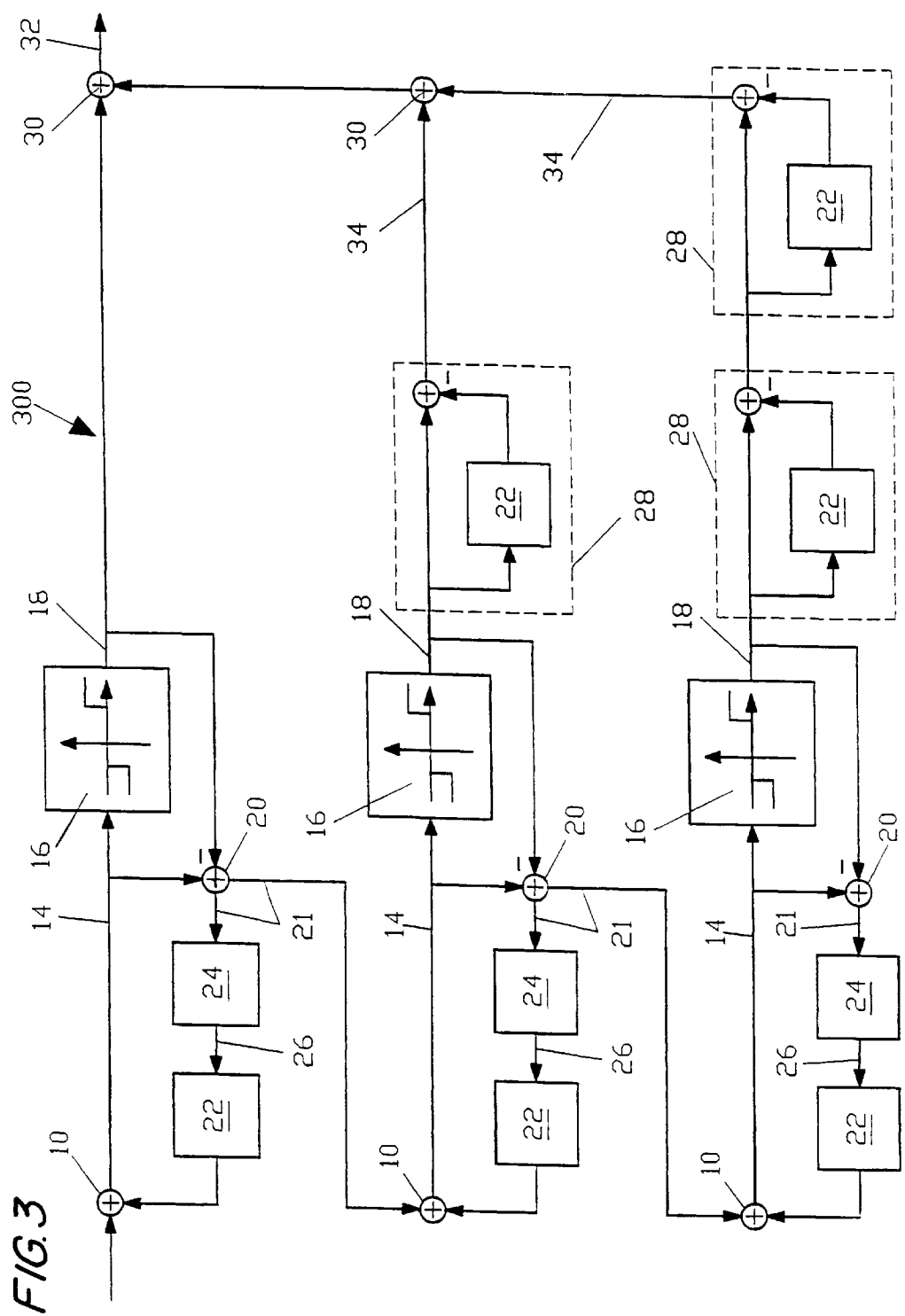
FIG. 3 shows a third preferred embodiment form of a sigma-delta D-A converter according to the invention.

The following possible range of values of the output signal $y(k)$ at 32 is given for the third preferred embodiment form of a sigma-delta D-A converter 300, according to the invention in FIG. 3:

Signal $y_1(k)$ has possible values 1, 0, −1.
Signal $y_2(k)$ has possible values ½, 0, −½.
Signal $y_3(k)$ has possible values ¼, 0, −¼.
After the differentiator 28 of the second stage, $y_{2d}(k)$ has possible values
1, ½, 0, ½, −1.
After the second differentiator 28 of the third stage, $y_{3d}(k)$ has possible values
1, ¾, ½, ¼, 0, −¼, −½, −¾, −1.
Signal $y(k)$ therefore has the following theoretical range of values at 32:
3, 2.75, 2.5, 2.25, 2, 1.75, 1.5, 1.25, 1, 0.75, 0.5, 0.25, 0, −0.25, −0.5, −0.75, −1, −1.25, −1.5, −1.75, −2, −2.25, −2.5, −2.75, −3.
Of these 25 states, only the following 15 states occur:
1.75, 1.5, 1.25, 1, 0.75, 0.5, 0.5, 0.25, 0, −0.25, −0.5, −0.75, −1, −1.25, −1.5, −1.75,
which can be proven again by analogous contradiction as before.

In conclusion, a sigma-delta D-A converter is given according to the invention with asymptotically stable behavior, for example, with three stages (FIG. 3), in which no limit cycles exist and which forms an input signal zero in infinity on an output signal zero, so that noise is minimized during those times in which the sigma-delta D-A converter is not excited. Through specific selection of the quantization function $q_n(e_n(k))$, the three-stage sigma-delta D-A converter 300 according to FIG. 3 requires, for example, only 15 output stages so that a corresponding expenditure on subsequent circuits, for example, a resistance network or corresponding current pumps, is considerably reduced even with long word lengths w of 32 bits, for example.

What is claimed is:

1. Sigma-delta D-A converter (100, 200, 300) with N stages, in which the nth stage, where n=1, 2, 3 ... N, comprises a first adder (10) which adds a use signal $x(k)$ (12) with an error signal $err_n(k-1)$ to an input signal $e_n(k)$ (14), a quantizer (16) which quantizes the input signal $e_n(k)$ (14) to an output signal $y_n(k)$ (18) according to a predetermined quantization function, and a second adder (20) which adds the input signal $e_n(k)$ (14) with the inverted output signal $y_n(k)$ to $x_n(k)$ (21), and supplies it to a delay device (22) which sends the signal $x_n(k)$ (21) to the first adder (10) as an error signal $err_n(k-1)$ with a delay by a clock period, characterized in that an amount reducer (24) is provided between the second adder (20) and the delay device (22), which amount reducer (24) leaves the signal $x_n(k)$ (21) unchanged when $x_n(k)=0$ and otherwise lowers the amount $|x_n(k)|$ of the signal $x_n(k)$ (21) by at least a smallest representable numerical unit, wherein the quantization function of the quantizer (16) of the nth stage of the sigma-delta D-A converter (100, 200, 300) is expressed as follows:

$$y_n(k) = \begin{cases} 2^{(1-n)}, & \text{if } e_n(k) > 2^{-n} \\ 0, & \text{if } \text{abs}(e_n(k)) \leq 2^{-n} \\ -2^{(1-n)}, & \text{if } e_n(k) < -2^{-n}. \end{cases}$$

2. Sigma-delta D-A converter (200, 300) according to claim 1, characterized in that a use signal of the nth stage, where n>1, is the output signal $x_{n-1}(k)$ (21) of the second adder (20) of the (n−1)th stage.

3. Sigma-delta D-A converter (200, 300) according to claim 1, characterized in that the nth stage (n−1) has differentiators (28) following the quantizer (16).

4. Sigma-delta D-A converter (200, 300) according to claim 1, characterized in that the first (N−1) stages, where N>1, each have a third adder (30) which follows the quantizer (16) in the case of the first stage and which follows the differentiators (28) in the case of the second to (N−1)th stage, wherein every third adder (30) of the first to (N−2)th stages is connected with the respective third adder (30) of the next highest stage and the third adder (30) of the (N−1)th stage is connected with the last differentiator (28) of the Nth stage.

* * * * *